US012787703B2

(12) United States Patent
Weaver

(10) Patent No.: US 12,787,703 B2
(45) Date of Patent: Nov. 3, 2026

(54) AUTOMATIC ALIGNMENT OF OVERHEAD TRANSPORT VEHICLES TO LOAD PORTS OF SEMICONDUCTOR FABRICATION TOOLS

(71) Applicant: Movensys Corporation, Somerville, MA (US)

(72) Inventor: Kota Weaver, Allston, MA (US)

(73) Assignee: Movensys Corp., Somerville, MA (US)

( * ) Notice: Subject to any disclaimer, the term of this patent is extended or adjusted under 35 U.S.C. 154(b) by 258 days.

(21) Appl. No.: 18/369,484

(22) Filed: Sep. 18, 2023

(65) Prior Publication Data

US 2024/0096676 A1 Mar. 21, 2024

Related U.S. Application Data

(60) Provisional application No. 63/407,473, filed on Sep. 16, 2022.

(51) Int. Cl.

| | |
|---|---|
| ***H10P 72/50*** | (2026.01) |
| ***G06T 7/73*** | (2017.01) |
| ***H10P 72/30*** | (2026.01) |

(52) U.S. Cl.

CPC ................ *H10P 72/53* (2026.01); *G06T 7/73* (2017.01); *H10P 72/3221* (2026.01); *H10P 72/38* (2026.01); *G06T 2207/30148* (2013.01)

(58) Field of Classification Search

CPC . H01L 21/68; H01L 21/681; H01L 21/67733; H01L 21/67739; H01L 21/67796; H10P 72/50; H10P 72/53; H10P 72/3221; H10P 72/38

USPC .................................................... 414/222.04

See application file for complete search history.

(56) References Cited

U.S. PATENT DOCUMENTS

| | | | | |
|---|---|---|---|---|
| 10,242,898 | B2 * | 3/2019 | Kinugawa | H01L 21/67733 |
| 2024/0128113 | A1 * | 4/2024 | Shimizu | B66C 13/46 |

* cited by examiner

*Primary Examiner* — Michael McCullough
*Assistant Examiner* — Jessica L Burkman
(74) *Attorney, Agent, or Firm* — Spano Law Group; Joseph S. Spano

(57) ABSTRACT

Methods and systems for automatically aligning an overhead hoist transport (OHT) vehicle with a load port of a wafer fabrication tool during operation and at the installation phase of the equipment in a semiconductor fabrication facility are described herein. In one aspect, an alignment frame including a digital image capture device is mounted to a wafer-in-progress (WIP) carrying pod. An image captured by the image capture device is analyzed to determine a positioning error of the OHT vehicle relative to the alignment frame based on the location of the OHT vehicle within the image. In another aspect, an inertial measurement device is coupled to a gripper assembly of an OHT vehicle. Inertial measurement signals are collected when the gripper assembly docks with a WIP carrying pod. The inertial measurement signals are analyzed to determine an initial positioning error of the gripper assembly with respect to the WIP carrying pod.

13 Claims, 12 Drawing Sheets

AUTOMATIC ALIGNMENT OF OVERHEAD TRANSPORT VEHICLES TO LOAD PORTS OF SEMICONDUCTOR FABRICATION TOOLS

CROSS REFERENCE TO RELATED APPLICATIONS

The present application for patent claims priority under 35 U.S.C. § 119 from U.S. provisional patent application Ser. No. 63/407,473, entitled "Method and System for Automatic Alignment of Overhead Hoist Transport Vehicles to Load Ports in Semiconductor Fabrication Plants," filed Sep. 16, 2022, the subject matter of which is incorporated herein by reference in its entirety.

TECHNICAL FIELD

The described embodiments relate to systems and methods for wafer transport in a semiconductor fabrication facility.

BACKGROUND INFORMATION

Semiconductor devices are fabricated by a sequence of processing steps applied to a wafer. The various features and multiple structural levels of the semiconductor devices are formed by these processing steps. For example, lithography, among others, is a semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices are fabricated on a single semiconductor wafer and then separated into individual semiconductor devices.

The sequence of processing steps are carried out by multiple different wafer processing tools, e.g., lithography tools, etch tools, etc. As such, wafers must be transported from one tool to another to progress through the sequence of wafer processing steps. Typically, in a high volume wafer fabrication facility, wafers are transported from one tool to another in groups, rather than individually. Each set of production wafers is stored in a wafer-in-progress (WIP) carrying pod. One example of a WIP carrying pod is a standardized front opening unified pod (FOUP) commonly employed in semiconductor fabrication facilities. A WIP carrying pod provides a controlled, protected environment for the wafers as they move from one tool to another. Typically, a WIP carrying pod is docked onto a load port of a semiconductor fabrication tool. A load port subsystem extracts the wafers from the WIP carrying pod individually, prepares each wafer for processing, and returns the processed wafers to the WIP carrying pod. The WIP carrying pod is then undocked from the load port of the semiconductor fabrication tool and transported to the next process destination, e.g., the next wafer processing tool in the sequence, a storage rack, etc.

In modern semiconductor fabrication facilities, an overhead hoist transport (OHT) system is commonly employed to dock, undock, and transport WIP carrying pods among various process destinations. An OHT system typically includes many OHT vehicles traveling along tracks suspended from the ceiling of the semiconductor fabrication facility. Typically, the tracks and OHT vehicles are located above the load ports of wafer processing machines. An OHT vehicle travels along a track and stops directly above a load port of a wafer processing tool. Each OHT vehicle typically employs a cable drive system to lower and raise a gripper assembly that selectively attaches to and detaches from a WIP carrying pod. When collecting a WIP carrying pod from a load port, the gripper assembly is lowered from the OHT vehicle to the WIP carrying pod. The gripper assembly grasps a handle feature attached to the top of the WIP pod. The OHT vehicle then hoists the gripper assembly and the attached WIP carrying pod into the OHT vehicle payload bay. Once the WIP carrying pod is secured in the OHT vehicle payload bay, the OHT vehicle moves along the track system to the next process destination. When depositing a WIP carrying pod onto a load port of a wafer processing tool, the gripper assembly and the attached WIP carrying pod are lowered from the OHT vehicle to the load port. The gripper assembly releases the handle feature attached to the top of the WIP pod, effectively detaching the WIP carrying pod from the gripper assembly. The OHT vehicle then hoists the unloaded gripper assembly into the OHT vehicle payload bay. The OHT vehicle then moves along the track system to another destination.

FIG. 1 is a simplified diagram illustrative of an OHT system 100 positioned above a load port 120 of a wafer fabrication tool in one embodiment. As depicted in FIG. 1, OHT system 100 includes a track 101 and an OHT vehicle 102. Actuators 103 are employed to move OHT vehicle 102 along track 101. Cables 104A and 104B suspend a gripper assembly 105 from OHT vehicle 102. A cable drive system (not shown) of OHT vehicle 102 is employed to raise and lower gripper assembly 105. Gripper assembly 105 includes gripper elements 106A and 106B. As indicated by the arrows depicted in FIG. 1, actuators (not shown) of gripper assembly 105 move gripper elements 106A and 106B laterally. Gripper assembly 105 also includes an alignment feature 107 to facilitate alignment with WIP carrying pod 110.

FIG. 1 also depicts a WIP carrying pod 110 positioned on load port 120. As depicted in FIG. 1, WIP carrying pod 110 includes a carrying feature 109 coupled to WIP carrying pod 110. Carrying feature 109 includes an alignment feature 108 that matches with alignment feature 107 when gripper assembly 105 is aligned and in contact with carrying feature 109. In one example, as depicted in FIG. 1, gripper assembly 105 is undocked from the OHT vehicle payload bay and is in transit between the OHT vehicle payload bay and WIP carrying pod 110. This configuration is typical when the gripper assembly is being moved into position to lock onto carrying feature 109 of WIP carrying pod 110 or is being moved into the OHT vehicle payload bay after unlocking from WIP carrying pod 110.

FIG. 2 is a simplified diagram illustrative of gripper assembly 105 aligned with and locked onto carrying feature 109 of WIP carrying pod 110. As depicted in FIG. 2, alignment features 107 and 108 are in contact and dictate the position of gripper assembly 105 with respect to carrying feature 109. In addition, gripper elements 106A and 106B are moved into a clamped position, i.e., both are moved toward carrying feature 109, that effectively locks gripper assembly 105 to carrying feature 109. This configuration is typical when the WIP carrying pod 110 is positioned on load port 120 and the gripper assembly 105 and WIP carrying pod 110 are about to be moved toward the OHT vehicle payload bay or gripper elements 106A and 106B are about to be moved into a unclamped position, i.e., away from carrying feature 109, to effectively unlock gripper assembly 105 from carrying feature 109.

FIG. 3 is a simplified diagram illustrative of gripper assembly 105 and WIP carrying pod 110 secured in the OHT vehicle payload bay. This configuration is typical when the OHT vehicle 102 is about to move WIP carrying pod 110 to another process destination or the gripper assembly 105 is about to move WIP carrying pod 110 toward load port 120.

A common problem with OHT systems is misalignment between the OHT vehicle and the WIP carrying pod located on the load port. The alignment features 107 and 108 mechanically register the gripper assembly 105 to the carrying feature of the WIP carrying pod when they come into contact. But, the registration is successful when misalignment is small. When misalignment exceeds a relatively small tolerance, the gripper assembly is unable to securely lock onto the WIP carrying pod. At minimum, this causes faults which require operator intervention. However, in some cases, failure to properly secure the payload causes the OHT vehicle to drop the WIP carrying pod, causing damage to the WIP carrying pod, damage to the wafers contained inside the pod, and operational delays. The cost of these accidents can easily total hundreds of thousands of dollars. To reduce the likelihood of such accidents, alignment of OHT systems and WIP carrying pods located on load ports of wafer processing tools is performed when setting up a new semiconductor fabrication facility. In addition, the alignment procedure is repeated periodically to ensure that any misalignments that may arise over time, e.g., due to physical drift of position of the equipment, accumulated position measurement errors, etc., stay well within the mechanical tolerance of the alignment features.

Currently, alignment of each OHT vehicle and a WIP carrying pod located on a load port is performed manually. This is a labor intensive, time-consuming, and costly process. When a new semiconductor fabrication facility is brought online, the alignment of hundreds of OHT vehicles can take weeks to complete. Furthermore, periodic realignment is performed manually and requires production to halt during each realignment session.

In summary, improvements to OHT systems are desired to enable fast and accurate initial alignment with load ports of wafer fabrication tools. In addition, improvements to OHT systems are desired to enable periodic realignment with load ports of wafer fabrication tools without interfering with the production process.

SUMMARY

Methods and systems for automatically aligning an overhead hoist transport (OHT) vehicle with a load port of a wafer fabrication tool during operation and at the installation phase of the equipment in a semiconductor fabrication facility are described herein.

In one aspect, an automated wafer carrying pod alignment system automatically aligns an overhead hoist transport (OHT) vehicle with a load port of a wafer fabrication tool at the installation phase of the equipment in a semiconductor fabrication facility. During installation, alignment of OHT vehicles to load ports of wafer fabrication tools is achieved in a fraction of the time required to perform the alignment manually. This results in significant cost savings for semiconductor fabrication facilities having hundreds of wafer fabrication tools.

An alignment frame includes one or more geometric features that locate the alignment frame at a pre-determined position relative to a wafer-in-progress (WIP) carrying pod in more than one degree of freedom when the alignment frame is in contact with the WIP carrying pod. A digital image capture device is coupled to the alignment frame. The field of view of the digital image capture device is oriented in a direction opposite the WIP carrying pod. An image of an overhead hoist transport (OHT) vehicle is captured by the digital image capture device when the OHT vehicle is within the field of view of the digital image capture device. The image is analyzed to determine a location of the OHT vehicle within the image. A positioning error of the OHT vehicle relative to the alignment frame is determined based on the location of the OHT vehicle within the image. The positioning error is communicated to the OHT vehicle. In some embodiments, a positioning set point of the OHT vehicle is adjusted to reduce the positioning error of the OHT vehicle relative to the alignment frame.

In another aspect, an automated wafer carrying pod alignment system continuously and automatically aligns an overhead hoist transport (OHT) vehicle with a load port of a wafer fabrication tool during operation of the equipment in a semiconductor fabrication facility. In this manner, the misalignment between an overhead hoist transport (OHT) vehicle and a load port of a wafer fabrication tool remains well within limits that would require an off-line realignment exercise.

An inertial measurement device is coupled to a gripper assembly of an overhead hoist transport (OHT) vehicle. The gripper assembly includes one or more geometric features that locate the gripper assembly at a pre-determined position relative to a wafer-in-progress (WIP) carrying pod when the gripper assembly is docked with the WIP carrying pod. The inertial measurement device generates measurement signals indicative of an acceleration, a velocity, or both, of the gripper assembly as the gripper assembly docks with the WIP carrying pod. The measurement signals are analyzed to determine an initial positioning error of the gripper assembly with respect to the WIP carrying pod. The initial positioning error is communicated to the OHT vehicle. In some embodiments, a positioning set point of the OHT vehicle is adjusted to reduce the initial positioning error of the OHT vehicle relative to the alignment frame.

The foregoing is a summary and thus contains, by necessity, simplifications, generalizations, and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for automatically aligning overhead hoist transport (OHT) vehicles with load ports of wafer fabrication tools during operation and at the installation phase of the equipment in a semiconductor fabrication facility are described herein. During installation, alignment of OHT vehicles to load ports of wafer fabrication tools is achieved in a fraction of the time required to perform the alignment manually. This results in significant cost savings for semiconductor fabrication facilities having hundreds of wafer fabrication tools.

In one aspect, an automated wafer carrying pod alignment system automatically aligns an overhead hoist transport (OHT) vehicle with a load port of a wafer fabrication tool at the installation phase of the equipment in a semiconductor fabrication facility.

Figure 4:
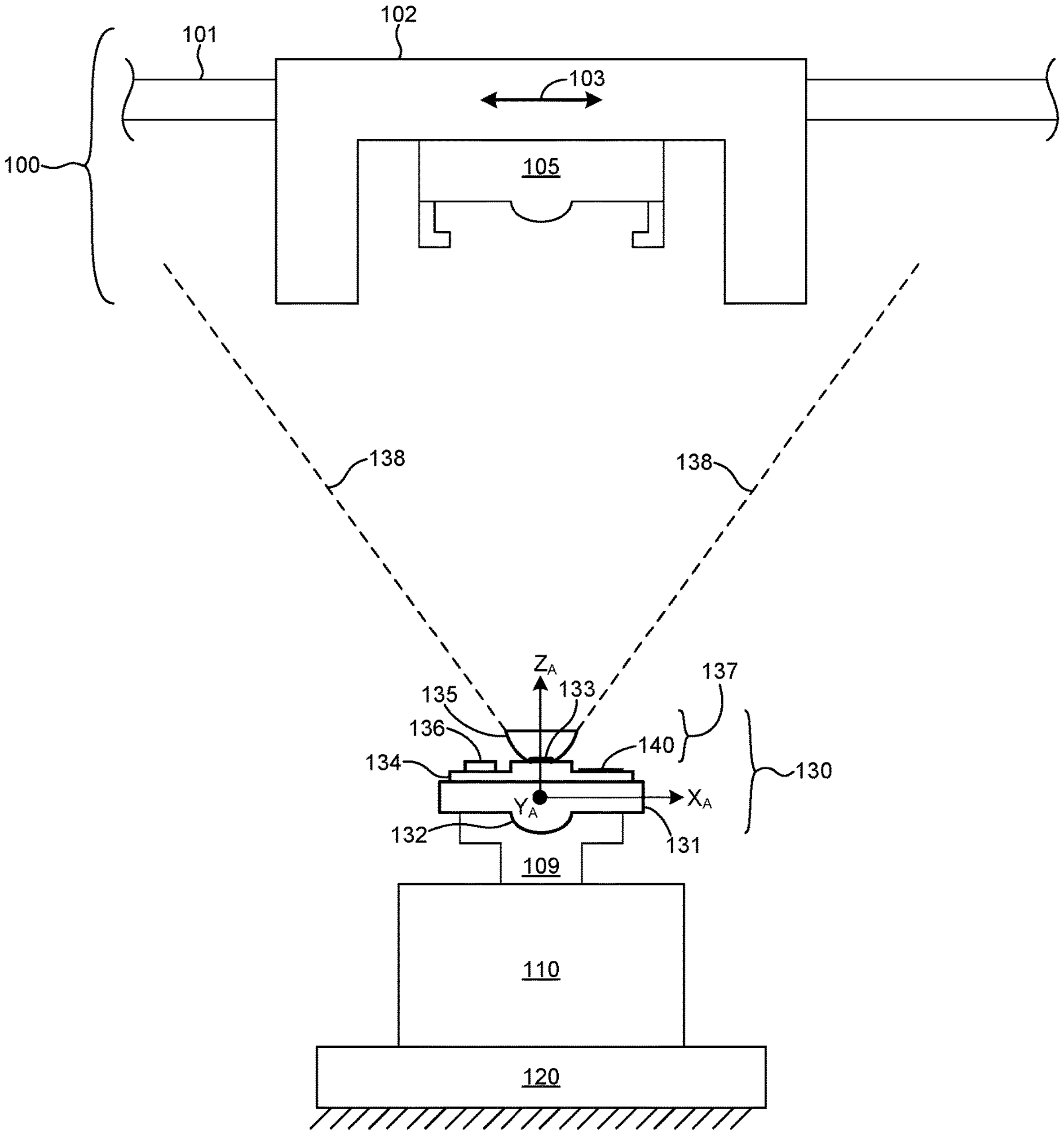
FIG. 4 is a simplified diagram illustrative of an automated wafer carrying pod alignment system in one embodiment.

FIG. 4 is a simplified diagram illustrative of an automated wafer carrying pod alignment system 130 in one embodiment. As depicted in FIG. 4, automated wafer carrying pod alignment system 130 includes an alignment frame 131 including one or more geometric features 132 that locate the alignment frame 131 at a pre-determined position relative to carrying feature 109 of wafer-in-progress (WIP) carrying pod 110. The alignment features 132 register the alignment frame 131 to the WIP carrying pod 110 when the alignment features 132 are in contact with the complementary alignment features of carrying handle 109. As depicted in FIG. 4, alignment coordinate frame $\{X_A, Y_A, Z_A\}$, is fixed to WIP carrying pod 110 (axis Y A is oriented into the drawing page). In some embodiments, alignment features 132 comprise a kinematic mount that locates alignment frame 131 at a pre-determined position relative to carrying feature 109 in six degrees of freedom, e.g., pre-determined position of alignment frame 131 along the $X_A$, $Y_A$, and $Z_A$ axes, and pre-determined orientation of alignment frame 131 about the $X_A$, $Y_A$, and $Z_A$ axes. However, in general, alignment feature 132 locates alignment frame 131 at a pre-determined position relative to carrying feature 109 in at least the $X_A$ direction. In many embodiments, alignment feature 132 locates alignment frame 131 at a pre-determined position relative to carrying feature 109 in the $X_A$ direction and pre-determined orientation about the $X_A$ and Y A axes. In some embodiments, the alignment features 132 mimics the alignment features employed as part of gripper assembly 105.

Automated wafer carrying pod alignment system 130 also includes a digital image capture device 137 coupled to alignment frame 131. In the embodiment depicted in FIG. 4, the digital image capture device 137 is mounted to an electronics mounting board 134, which is, in turn, mounted to alignment frame 131. In some other embodiments, digital image capture device 137 is directly mounted to alignment frame 131. In the embodiment depicted in FIG. 4, digital image capture device 137 includes an image detector 133 and an optical lens element 135. In general, image detector 133 is a photosensitive detector, e.g., a charge coupled device (CCD) detector, a complementary metal oxide on silicon (CMOS) detector, etc. Optical lens element 135 includes one or more optical elements employed to shape the field of view of digital image capture device 137.

As depicted in FIG. 4, the field of view 138 of digital image capture device 137 is oriented in a direction toward OHT vehicle 102 and opposite WIP carrying pod 110. In the embodiment depicted in FIG. 4, the size of field of view 138 expands from digital image capture device 137 toward OHT vehicle 102, and encompasses the entirety of OHT vehicle 102.

In some embodiments, digital image capture device 137 is an integrated stereo camera system. However, in general, any suitable image capture device may be employed.

Figure 5:
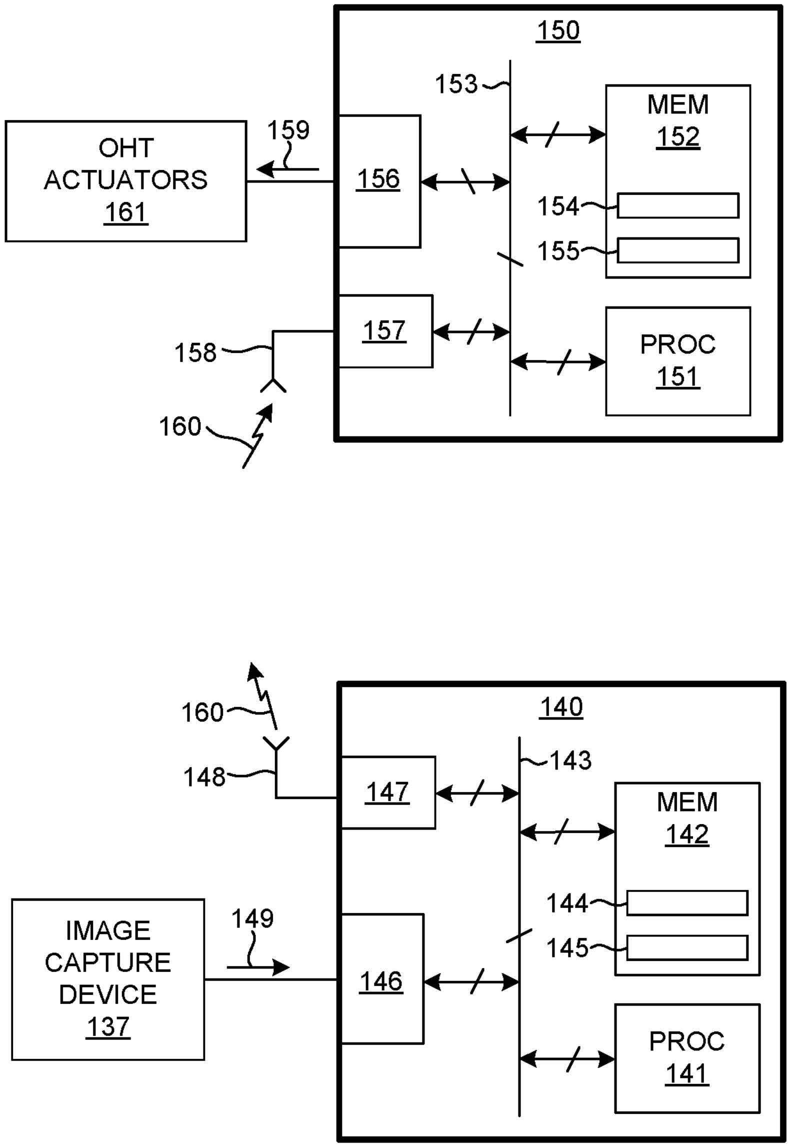
FIG. 5 is a simplified diagram illustrative of the automated wafer carrying pod alignment system depicted in FIG. 4 in greater detail.

Automated wafer carrying pod alignment system 130 also includes one or more computing systems coupled to the alignment frame. In the embodiment depicted in FIG. 4, computing system 140 is mounted to electronics mounting board 134, which is, in turn, mounted to alignment frame 131. In some other embodiments, computing system 140 is directly mounted to alignment frame 131. In some other embodiments, computing system 140 is integrated with a digital image capture device 137, and the integrated unit is mounted to alignment frame 131. As depicted in FIG. 5, computing system 140 includes a sensor interface 146, at least one processor 141, a memory 142, a bus 143, and a wireless communication transceiver 147. Sensor interface 146, processor 141, memory 142, and wireless communication transceiver 147 are configured to communicate over bus 143. In some embodiments, computing system 140 is a single board computer system, e.g., a single board computer manufactured by Raspberry Pi, etc.

Sensor interface 146 includes a digital input/output interface configured to communicate with digital image capture device 137 and receive digital image data 149 captured by digital image capture device 137. In this example, digital image capture device 137 includes on-board electronics to generate digital signals 149 indicative of captured images.

Memory 142 includes an amount of memory 144 that stores image data communicated from digital image capture device 137. Image data 149 stored in memory 144 is employed to estimate position alignment errors of the OHT vehicle 102 relative to WIP carrying pod 110. Memory 142 also includes an amount of memory 145 that stores program code that, when executed by processor 141, causes processor 141 to implement automatic alignment functionality as described herein.

In some examples, processor 141 is configured to store digital image data 149 received by sensor interface 146 onto memory 144. In addition, processor 141 is configured to read the digital image data 149 stored on memory 144 and estimate alignment errors based on the digital image data 149. In addition, processor 141 is configured to transmit signals indicative of the estimated alignment errors to wireless communication transceiver 147. In some embodiments, wireless communications transceiver 147 is configured to wirelessly communicate radio frequency signals 160 indicative of the estimated alignment errors from computing system 140 to computing system 150 over a wireless communications link. As depicted in FIG. 5, wireless communications transceiver 147 transmits radio frequency signals 160 over antenna 148. The radio frequency signals 160 include digital information indicative of the estimated alignment errors to be communicated from computing system 140 to computing system 150.

In general, computing system 150 is integrated with OHT system 100. In some embodiments, computing system 150 is integrated with OHT vehicle subsystem 102. In some other embodiments, computing system 150 is remotely located from OHT vehicle subsystem 102.

As depicted in FIG. 5, computing system 150 includes controlled device interface 156, at least one processor 151, a memory 152, a bus 153, and a wireless communication transceiver 157. Controlled device interface 156, processor 151, memory 152, and wireless communication transceiver 157 are configured to communicate over bus 153.

Processor 151 is configured to receive signals indicative of the estimated alignment errors from wireless communication transceiver 157. In some embodiments, wireless communications transceiver 157 is configured to wirelessly receive radio frequency signals 160 indicative of the estimated alignment errors from computing system 140 over a wireless communications link. As depicted in FIG. 5, wireless communications transceiver 157 receives radio frequency signals 160 over antenna 158. The radio frequency signals 160 include digital information indicative of the estimated alignment errors.

Memory 152 includes an amount of memory 154 that stores an alignment position error signal communicated from computing system 140. In some examples, processor 151 is configured to store alignment position error signals received from computing system 140 onto memory 154. In addition, processor 151 is configured to read the alignment position error signals stored on memory 144 and generate an updated positioning set point based on the alignment positioning error. In some embodiments, processor 151 generates an updated positioning set point if the alignment positioning error exceeds a predetermined threshold value stored in a memory, e.g., stored in memory 154. If the alignment positioning error is smaller than the predetermined threshold value, then the positioning set point of OHT vehicle 102 is not updated. The predetermined threshold value is set to a value of alignment position error that ensures there is essentially no risk of misalignment between gripper assembly 105 and WIP carrying pod 110 during production.

In some embodiments, controlled device interface 156 includes a digital input/output interface configured to communicate digital control command signals 159 to actuators 161 of OHT vehicle 102 that cause OHT vehicle 102 to move to the updated positioning set point. This locates OHT vehicle 102 above WIP carrying pod 110 with a reduced alignment error. In some other embodiments, controlled device interface 156 includes appropriate digital to analog conversion (DAC) electronics configured to communicate analog control command signals 159 to actuators 161 of OHT vehicle 102 that cause OHT vehicle 102 to move to the updated positioning set point.

In some other embodiments, controlled device interface control command signal 159 is a signal indicative of the updated positioning set point communicated to a motion controller. The motion controller, in turn, communicates control signals to actuators 161 of OHT vehicle 102, which cause OHT vehicle 102 to move to the updated position set point.

Memory 142 also includes an amount of memory 145 that stores program code that, when executed by processor 141, causes processor 141 to implement automatic alignment functionality as described herein.

In some embodiments, automated wafer carrying pod alignment system 130 also includes a rechargeable battery coupled to the alignment frame. The rechargeable battery is electrically coupled to one or more computing systems, the digital image capture device, or both, and provides electrical power to the one or more computing systems, the digital image capture device, or both. In a preferred embodiment, the rechargeable battery powers both the one or more computing systems and the digital image capture device, so that automated wafer carrying pod alignment system 130 can be used to perform an alignment operation on a wafer fabrication tool and moved to another wafer fabrication tool without having to provide any electrical connections to the automated wafer carrying pod alignment system 130. In some embodiments, the rechargeable battery stores enough energy to power an automated wafer carrying pod alignment system for at least four hours before recharging is required.

In the embodiment depicted in FIG. 4, rechargeable battery 136 is mounted to electronics mounting board 134 and is electrically coupled to computing system 140 and digital image capture device 137. In some other embodiments, rechargeable battery 136 is mounted directly to alignment frame 131 and is electrically coupled to computing system 140 and digital image capture device 137.

Figure 6:
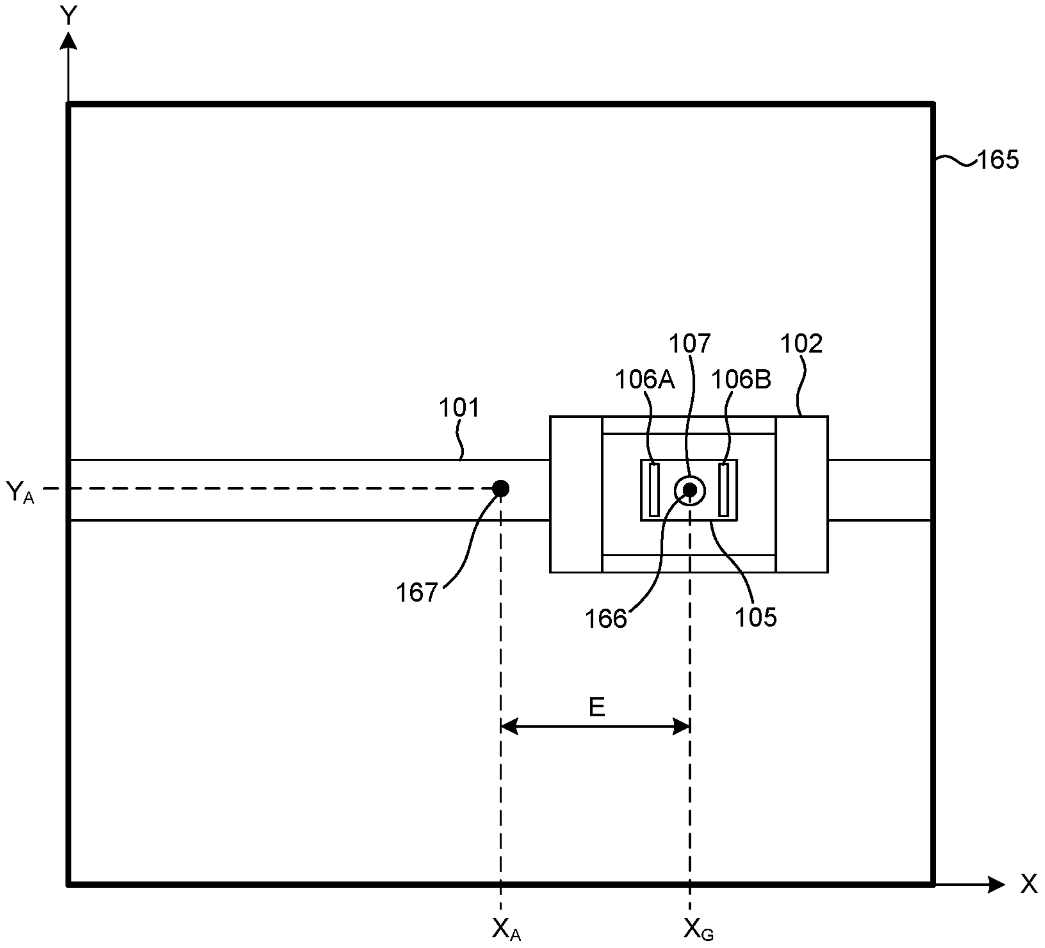
FIG. 6 is a simplified diagram illustrative of an image captured by a digital image capture device of an automated wafer carrying pod alignment system in one example.

As depicted in FIG. 4, digital image capture device 137 captures an image of OHT vehicle 102 when OHT vehicle 102 is within the field of view 138 of digital image capture device 137. FIG. 6 is a simplified diagram illustrative of an image 165 captured by digital image capture device 137. Image 165 includes various features of OHT system 100, including OHT track 101, OHT vehicle 102, gripper assembly 105, gripper elements 106A and 106B, and alignment feature 107.

Computing system 140 analyzes the detected image and determines a location of the overhead transportation vehicle within the detected image. In some examples, computing system 140 extracts one or more geometric features of the OHT vehicle from the image and determines the pixel locations associated with the one or more features in the image. The location of the OHT vehicle within the detected image is determined based on the pixel locations of the identified features. In some examples, the one or more extracted feature include the geometric features that locate the gripper assembly to the WIP carrying pod when the gripper assembly is in contact with the WIP carrying pod. In the example depicted in FIG. 6, features indicative of the geometry of alignment feature 107 are extracted by computing system 140, and the pixel location 166 associated with the center of alignment feature 107 is determined by computing system 140.

In addition, computing system 140 determines a positioning error of OHT vehicle 102 relative to the alignment frame based on the location of the overhead transportation vehicle within the detected image. The position of digital image capture device 137 is fixed with respect to alignment frame 131, which, in turn, is located at a pre-determined position relative to carrying feature 109 of WIP carrying pod 110. Therefore, the field of view of digital image capture device 137 captured by image 165 is fixed in position relative to WIP carrying pod 110. As a result, the pixel locations of image 165 correspond to different locations of a coordinate frame attached to WIP carrying pod 110.

Figure 1:
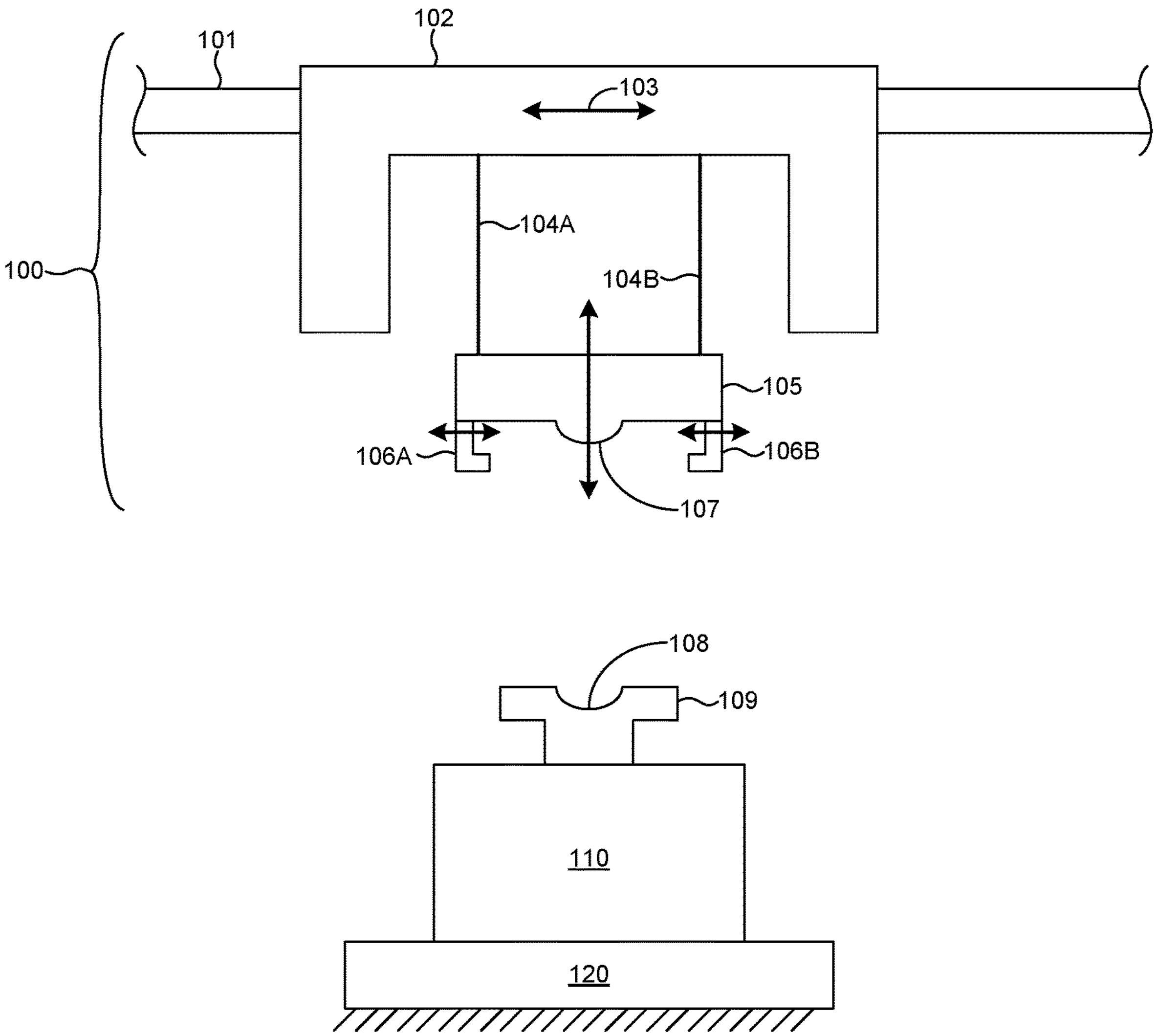
FIG. 1 (PRIOR ART)
FIG. 1 is a simplified diagram illustrative of an overhead hoist transport (OHT) system positioned above a load port of a wafer fabrication tool in one embodiment.

In one example, pixel location 167 having pixel coordinates ($X_A$, $Y_A$) within image 165 corresponds to the location of alignment feature 108 of carrying handle 109 depicted in FIG. 1. Moreover, the pixel location 166 associated with the center of alignment feature 107 has pixel coordinates ($X_G$, $Y_G$). If OHT vehicle 102 were perfectly aligned with WIP carrying pod 110, the pixel location 166 associated with the center of alignment feature 107 would be the same as pixel location 167 within image 165.

However, due to misalignment, there is an error, E, in the position of the center of alignment feature 107 with respect to the center of alignment feature 108 in the X-direction. The magnitude of this alignment error can be measured as the number of pixels separating pixel locations 166 and 167. Furthermore, the corresponding physical distance associated with the alignment error is determined based on the known pixel pitch at the detector 133 and the known geometric properties of the optical projection of the image of OHT vehicle 102 onto detector 133. In other words, the spacing between pixels in image 165 is known based on the pixel pitch of detector 133, the known distance between detector 133 and OHT vehicle 102 in the Z-direction, and any magnification properties of the optical elements 135. Therefore, a simple conversion factor is employed to transform the alignment error expressed in image space to the alignment position error expressed in physical space.

The alignment position error expressed in physical space is then communicated from computing system 140 to computing system 150. Computing system 150 then computes an updated set point position for OHT vehicle 150 that should close the gap between the current position of OHT vehicle 150 and a position of OHT vehicle 150 that should bring OHT vehicle 150 in alignment with WIP carrying pod 110. In some examples, the updated set point is determined by adding the alignment position error to the current set point. Computing system 150 then communicates control commands to the actuators of OHT vehicle 102 that cause OHT vehicle 102 to move to the updated set point position.

In some examples, the steps of collecting an image, estimating the alignment position error and updated position set point, and moving OHT vehicle 102 to the updated position set point are repeated, in sequence, until the alignment position error is smaller than a predetermined threshold value. At this point, the alignment associated with the position set point is deemed sufficiently close that no further adjustment of position set point is required.

After alignment of an OHT vehicle with respect to a load port is achieved, the automated wafer carrying pod alignment system 130 is removed from the WIP carrying pod 110 by a user and placed onto a WIP carrying pod located on another load port to be aligned.

Figure 7:
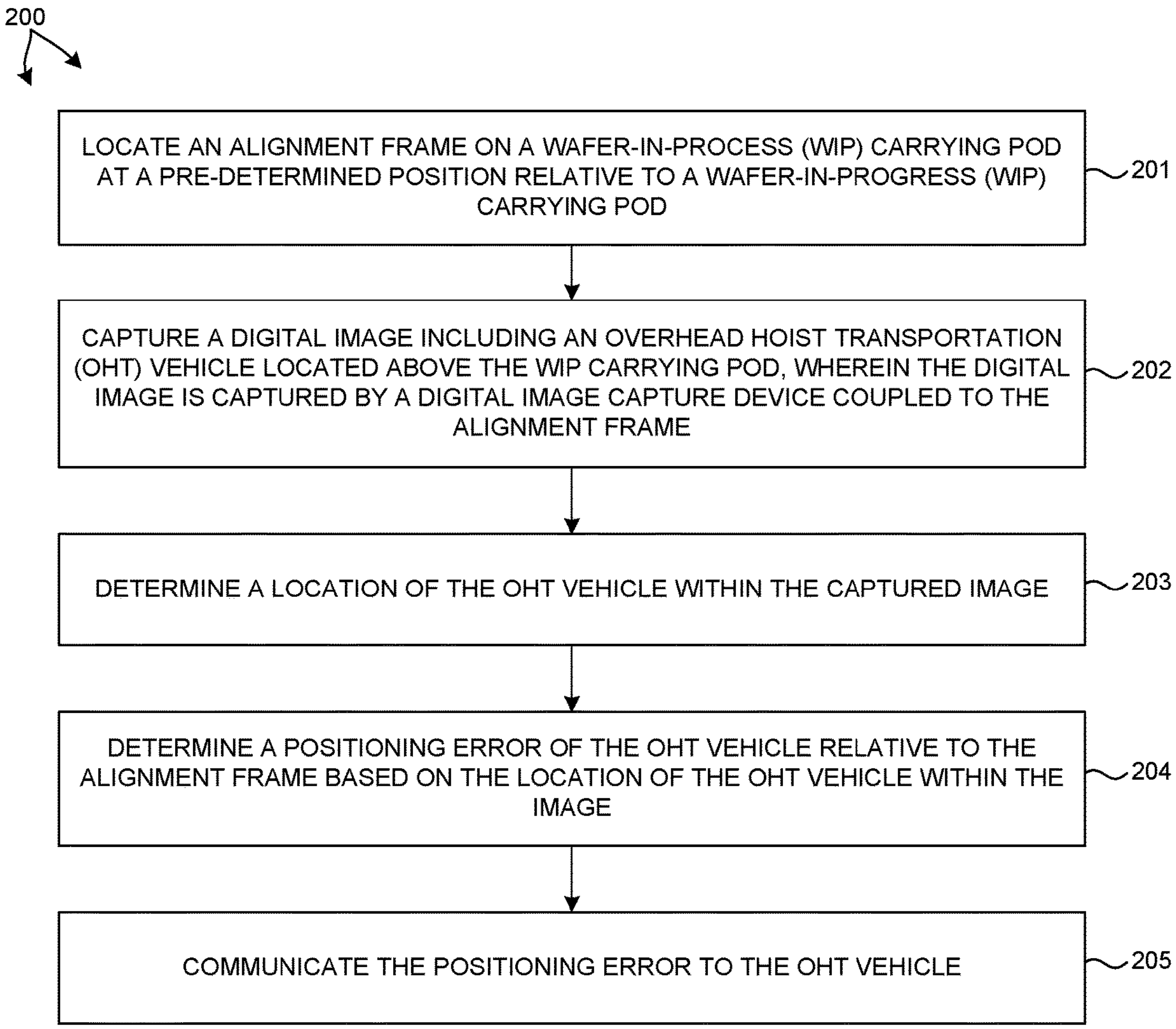
FIG. 7 illustrates a flowchart of a method suitable for alignment of an OHT system with respect to a load port of a wafer fabrication tool as described herein.

FIG. 7 illustrates a flowchart of a method 200 suitable for alignment of an OHT system with respect to a load port of a wafer fabrication tool as described herein. In some embodiments, an automated wafer carrying pod alignment system 130 described with reference to FIGS. 4-5 is operable in accordance with method 200 illustrated in FIG. 7. However, in general, the execution of method 200 is not limited to the embodiments of the automated wafer carrying pod alignment system described with reference to FIGS. 4-5. These illustrations and corresponding explanation are provided by way of example as many other embodiments and operational examples may be contemplated within the scope of this patent document.

In block 201, an alignment frame is located on a wafer-in-progress (WIP) carrying pod at a pre-determined position relative to a wafer-in-progress (WIP) carrying pod.

In block 202, a digital image including an overhead hoist transport (OHT) vehicle located above the WIP carrying pod is captured. The digital image is captured by a digital image capture device coupled to the alignment frame.

In block 203, a location of the OHT vehicle within the captured image is determined by a computing system.

In block 204, a positioning error of the OHT vehicle relative to the alignment frame is determined based on the location of the OHT vehicle within the image.

In block 205, the positioning error is communicated to the OHT vehicle.

Figure 2:
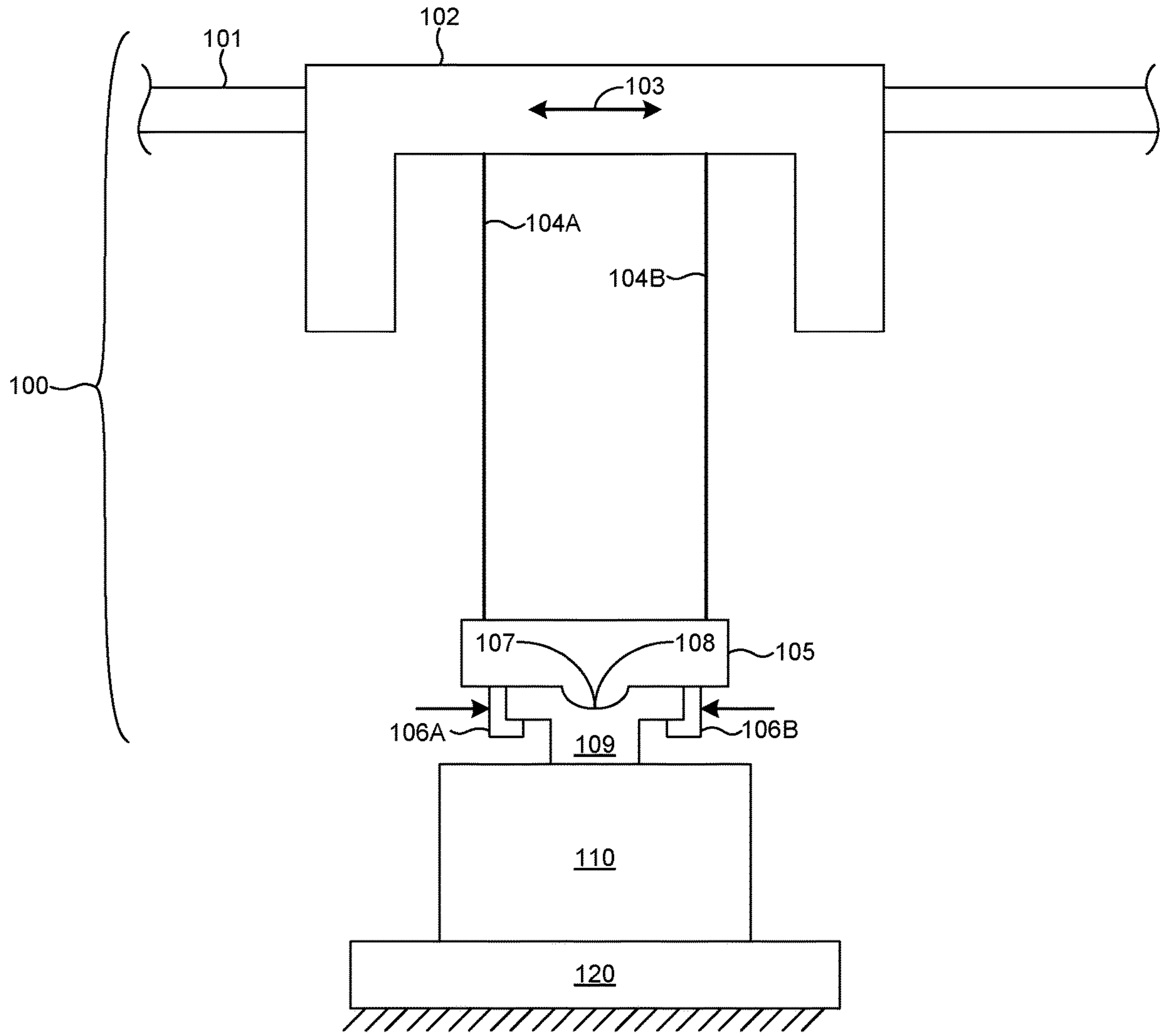
FIG. 2 (PRIOR ART)
FIG. 2 is a simplified diagram illustrative of a gripper assembly aligned with and locked onto a carrying feature of a wafer-in-progress (WIP) carrying pod.
Figure 3:
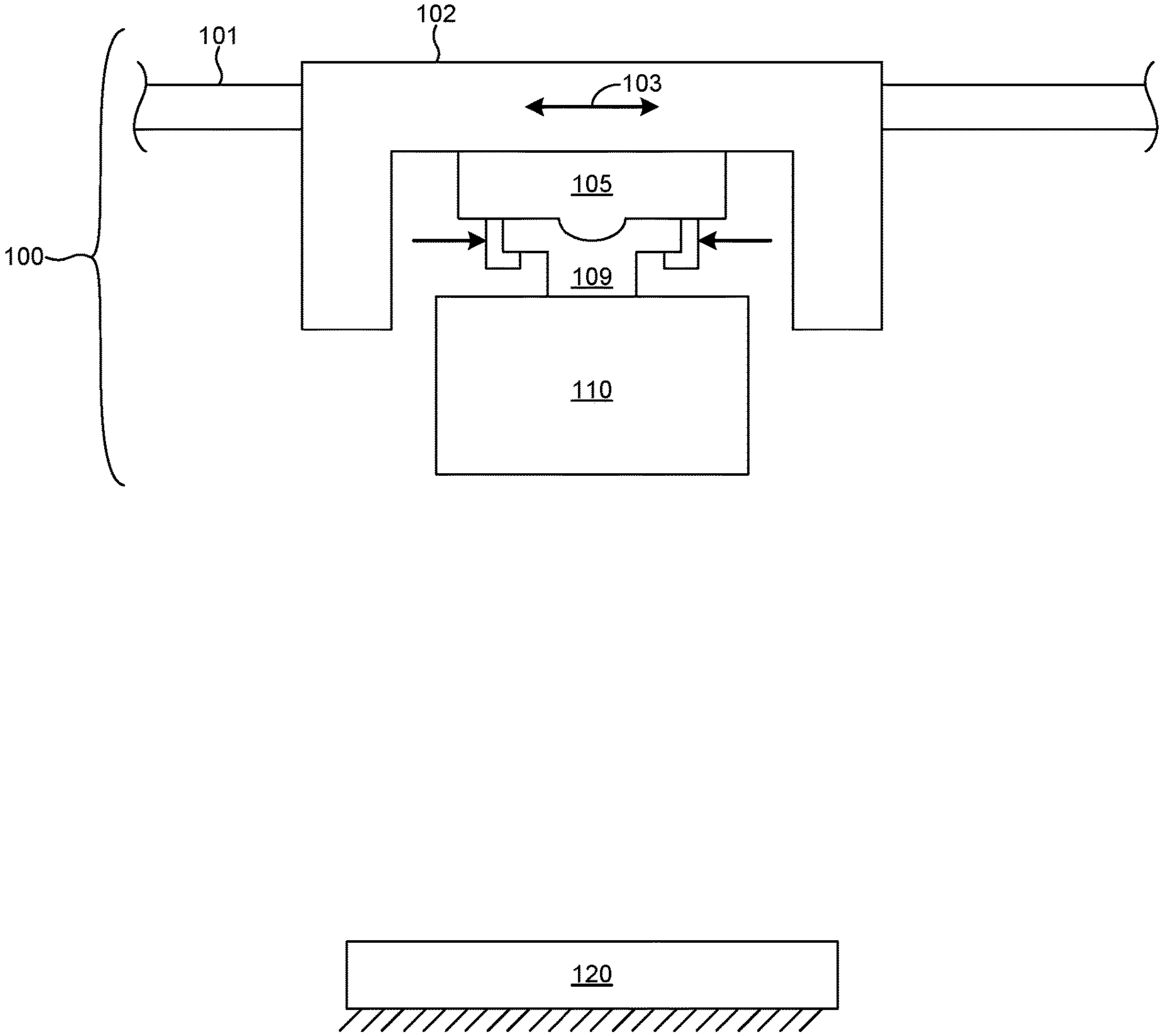
FIG. 3 (PRIOR ART)
FIG. 3 is a simplified diagram illustrative of a gripper assembly and WIP carrying pod secured in an OHT vehicle payload bay.
Figure 8:
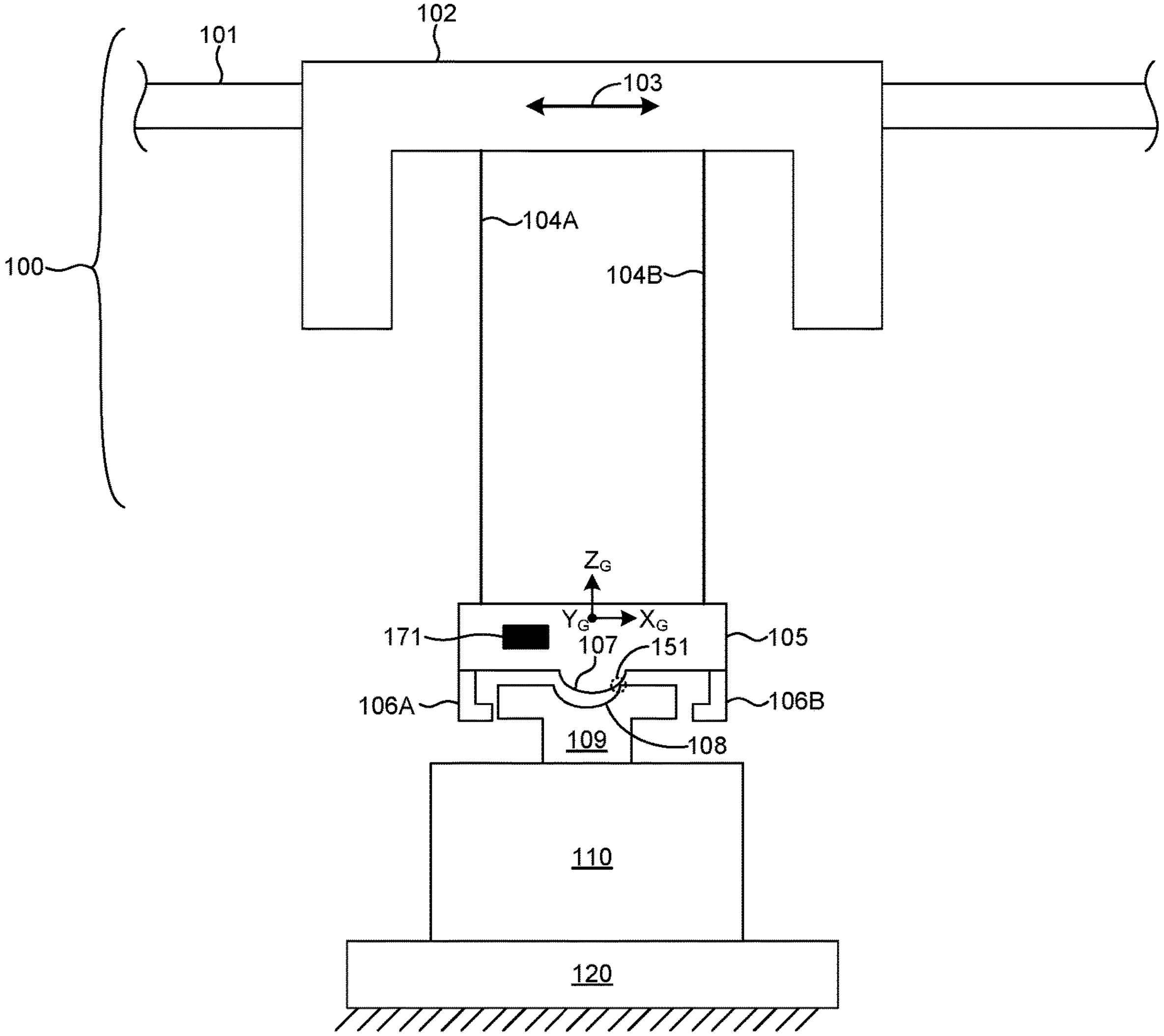
FIG. 8 is a simplified diagram illustrative of a gripper assembly brought into contact with a carrying handle of a WIP carrying pod at the instance of initial contact.

FIG. 8 is a simplified diagram illustrative of gripper assembly 105 brought into contact with carrying handle 109 of WIP carrying pod 110 at the instance of initial contact. Like numbered elements depicted in FIGS. 1-3 are analogous to those depicted in FIG. 8. As depicted in FIG. 8, there is a misalignment between gripper assembly 105 and carrying handle 109 in a direction aligned with the $X_G$ axis of the coordinate frame {$X_G$, $Y_G$, $Z_G$} attached to OHT vehicle 102. This initial positioning error prevents a smooth docking of gripper assembly to carrying handle 109.

Figure 9:
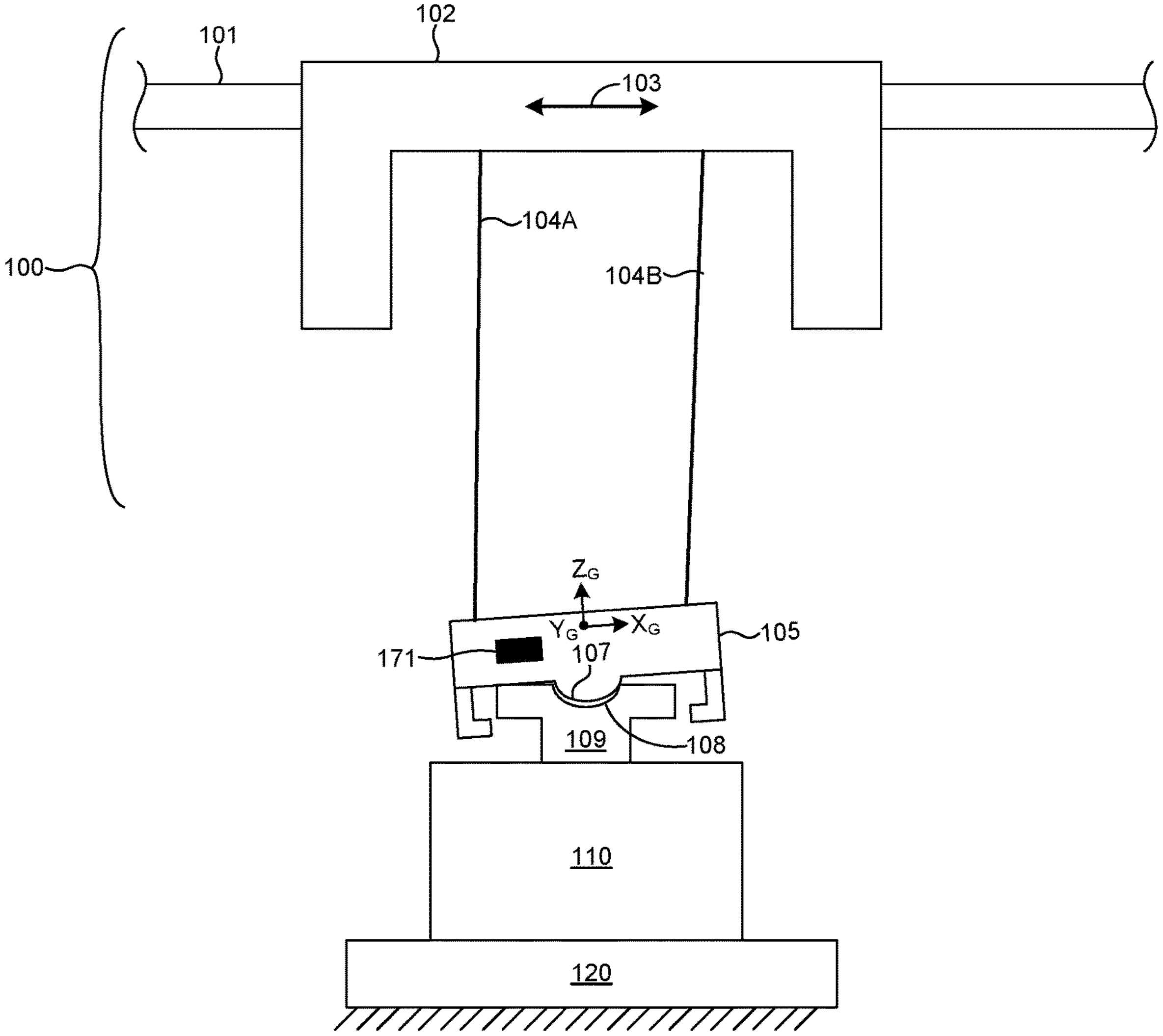
FIG. 9 is a simplified diagram illustrative of a gripper assembly brought into contact with a carrying handle of a WIP carrying pod at an instance after initial contact.

FIG. 9 is a simplified diagram illustrative of gripper assembly 105 brought into contact with carrying handle 109 of WIP carrying pod 110 at an instance after initial contact. Like numbered elements depicted in FIGS. 1-3 are analogous to those depicted in FIG. 9. As depicted in FIG. 9, contact between alignment feature 107 of gripper assembly 105 and alignment feature 108 of carrying handle 109 force a movement of gripper assembly in the negative $X_G$ direction and a rotation about the Y G axis.

Figure 10:
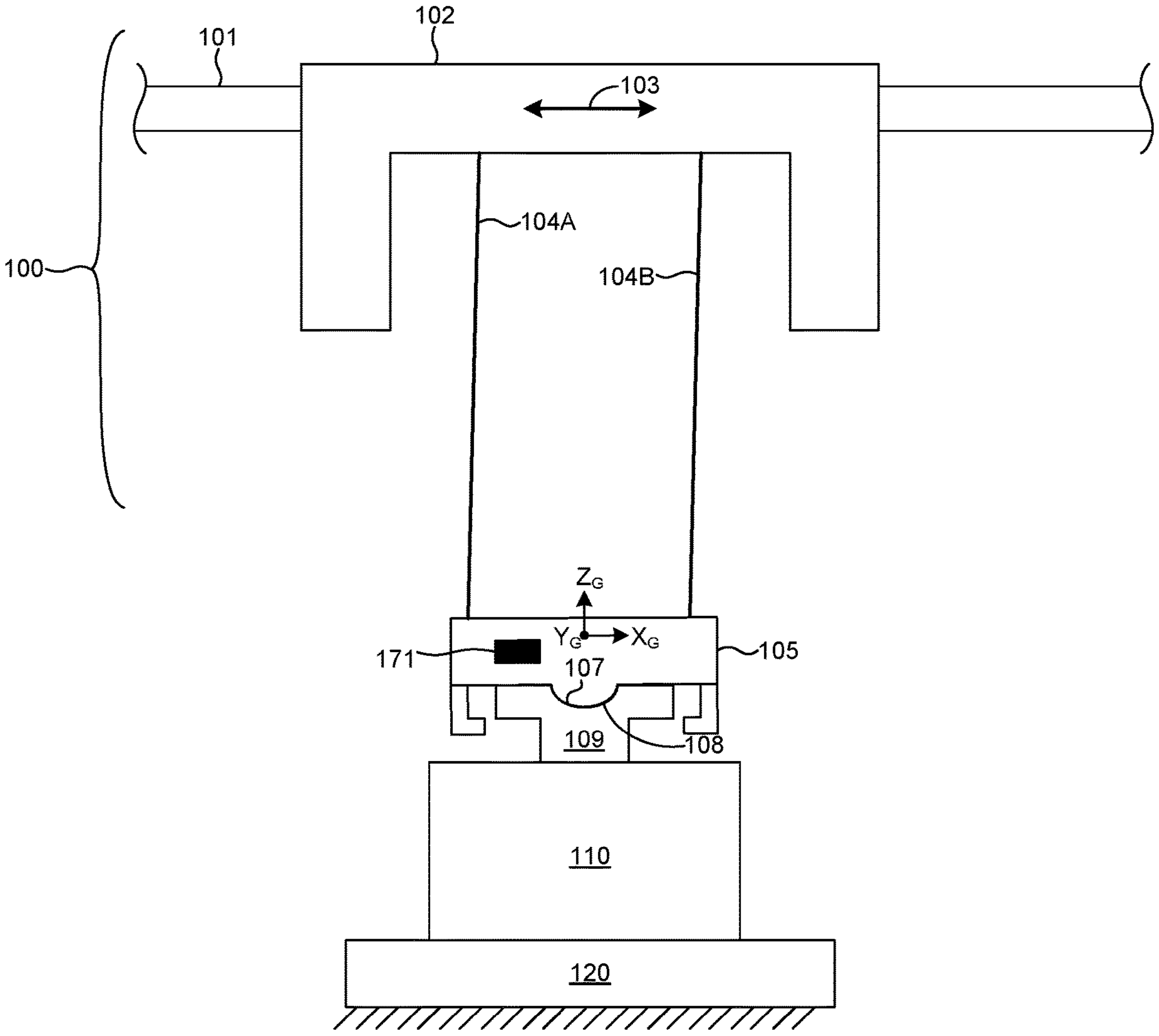
FIG. 10 is a simplified diagram illustrative of a gripper assembly brought into contact with a carrying handle of a WIP carrying pod at an instance after the instance depicted in FIG. 9.

FIG. 10 is a simplified diagram illustrative of gripper assembly 105 brought into contact with carrying handle 109 of WIP carrying pod 110 at an instance after the instance depicted in FIG. 9. Like numbered elements depicted in FIGS. 1-3 are analogous to those depicted in FIG. 9. As depicted in FIG. 10, alignment feature 107 of gripper assembly 105 and alignment feature 108 of carrying handle 109 are in full contact and in alignment. However, the full contact scenario forces a movement of gripper assembly 105 in the negative $X_G$ direction with respect to the set point position of OHT vehicle 102.

In the operational scenario depicted in FIGS. 8-10, the alignment features 107 and 108 force a realignment of gripper assembly 105 with respect to WIP carrying pod 110 to overcome a small misalignment between OHT vehicle 102 and WIP carrying pod 110. This is not an operational issue as long as the set point misalignment remains relatively small.

In another aspect, an automated wafer carrying pod alignment system continuously and automatically aligns an overhead hoist transport (OHT) vehicle with a load port of a wafer fabrication tool during operation of the equipment in a semiconductor fabrication facility. In this manner, the misalignment between an overhead hoist transport (OHT) vehicle and a load port of a wafer fabrication tool remains well within limits that would require an off-line realignment exercise.

Figure 11:
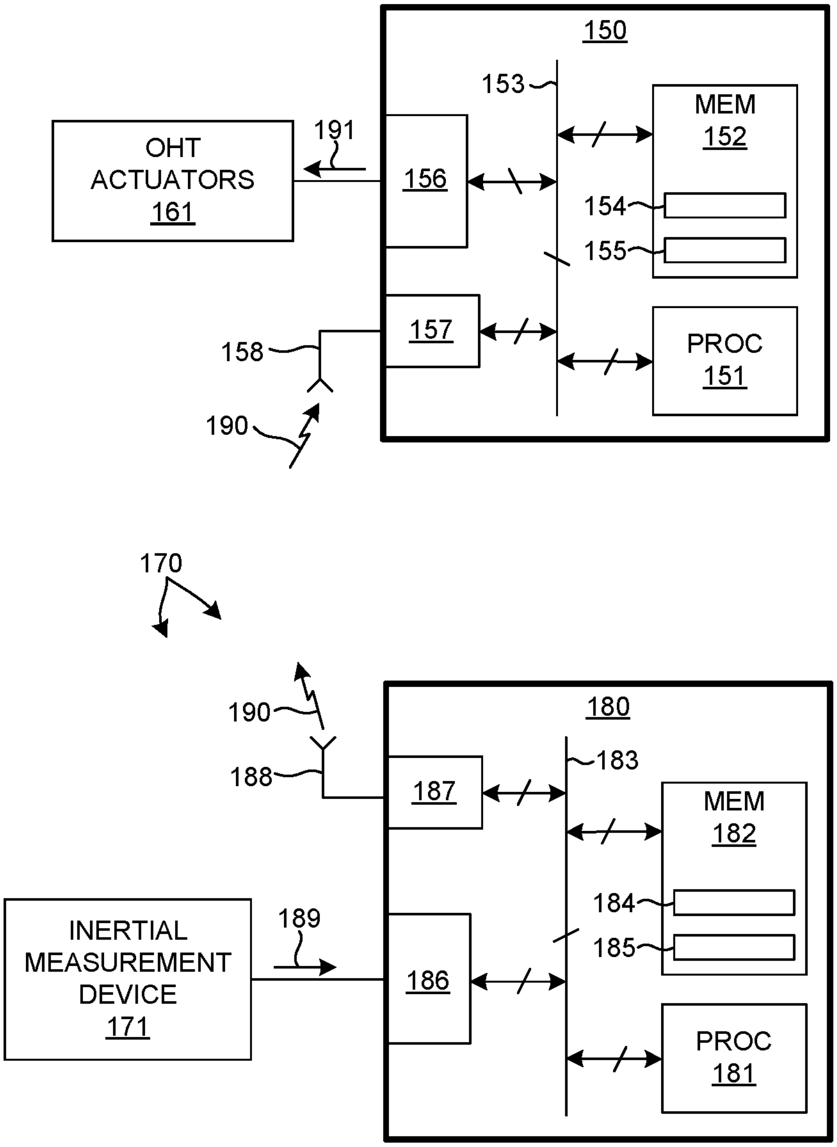
FIG. 11 depicts an automated wafer carrying pod alignment system in another embodiment.

FIG. 11 depicts an automated wafer carrying pod alignment system 170 in another embodiment. As depicted in FIGS. 8-11, automated wafer carrying pod alignment system 170 includes an inertial measurement device 171 coupled to a gripper assembly of an overhead hoist transport (OHT) vehicle. The inertial measurement device 171 is configured to generate measurement signals 189 indicative of an acceleration, a velocity, or both, of the gripper assembly as the gripper assembly docks with the WIP carrying pod.

As depicted in FIG. 11, automated wafer carrying pod alignment system 170 also includes one or more computing systems 180. As depicted in FIG. 11, computing system 180 includes a sensor interface 186, at least one processor 181, a memory 182, a bus 183, and a wireless communication transceiver 187. Sensor interface 186, processor 181, memory 182, and wireless communication transceiver 187 are configured to communicate over bus 183. In some embodiments, computing system 180 is a single board computer system, e.g., a single board computer manufactured by Raspberry Pi, etc.

Sensor interface 186 includes a digital input/output interface configured to communicate with inertial measurement device 171 and receive digital signals 189 measured by inertial measurement device 171. In this example, inertial measurement device 171 includes on-board electronics to generate digital signals 189 indicative of the measured accelerations, velocities, or both.

Memory 182 includes an amount of memory 184 that stores inertial measurement data communicated from inertial measurement device 171. Inertial measurement data 189 stored in memory 184 is employed to estimate position alignment errors of the OHT vehicle 102 relative to WIP carrying pod 110. Memory 182 also includes an amount of memory 185 that stores program code that, when executed by processor 181, causes processor 181 to implement automatic alignment functionality as described herein.

In some examples, processor 181 is configured to store inertial measurement data 189 received by sensor interface 186 onto memory 184. In addition, processor 181 is configured to read the inertial measurement data 189 stored on memory 184 and estimate alignment errors based on the inertial measurement data 189. In addition, processor 181 is configured to transmit signals indicative of the estimated alignment errors to wireless communication transceiver 187. In some embodiments, wireless communications transceiver 187 is configured to wirelessly communicate radio frequency signals 190 indicative of the estimated alignment errors from computing system 180 to computing system 150 over a wireless communications link. As depicted in FIG. 11, wireless communications transceiver 187 transmits radio frequency signals 190 over antenna 188. The radio frequency signals 190 include digital information indicative of the estimated alignment errors to be communicated from computing system 180 to computing system 150.

In the embodiment depicted in FIG. 11, computing system 180 and inertial measurement device 171 are mounted to an electronics mounting board (not shown) and packaged in a housing (not shown) that is mounted to gripper assembly 105. In some other embodiments, computing system 180 and inertial measurement device 171 are integrated in a single packaged device that is mounted to gripper assembly 105.

Computing system 180 analyzes the detected inertial measurement signals and determines an initial positioning error of the gripper assembly with respect to the WIP carrying pod based on the signals indicative of the acceleration, a velocity, or both, of the gripper assembly as the gripper assembly docks with the WIP carrying pod.

In some examples, computing system 180 integrates the signals indicative of the acceleration, a velocity, or both, to estimate the displacement of the gripper assembly in the $X_G$ direction as the gripper assembly 105 docks with the WIP carrying pod 110. The initial positioning error is estimated as the displacement in the $X_G$ direction of the gripper assembly with respect to the WIP carrying pod.

In some examples, the integration begins when the acceleration signal exceeds a predetermined threshold level. The predetermined threshold level is set to indicate when initial contact is made between the gripper assembly 108 and the carrying handle 109. If misalignment is significant, the initial contact between the gripper assembly 108 and the carrying handle 109 will cause a spike in acceleration. In some embodiments, the window of time subject to integration is set to a predetermined period of time corresponding to the expected time between initial contact and docking of the gripper assembly 105 to WIP carrying pod 110. In some other embodiments, the window of time subject to integration is determined based on an average acceleration or velocity. In these embodiments, the integration is terminated when average acceleration or velocity falls below a predetermined threshold value. The predetermined threshold value of average acceleration and velocity is set to a low value that indicates that gripper assembly 105 is docked and no longer moving significantly.

In addition, computing system 180 is configured to communicate the determined initial positioning error of the gripper assembly with respect to the WIP carrying pod to the OHT vehicle. In response, computing system 150 computes an updated set point position for OHT vehicle 150 that should close the gap between the current position of OHT vehicle 150 and a position of OHT vehicle 150 that should bring OHT vehicle 150 in alignment with WIP carrying pod 110. In some examples, the updated set point is determined by adding the initial positioning error to the current set point. Computing system 150 then communicates control commands 191 to the actuators 161 of OHT vehicle 102 that cause OHT vehicle 102 to move to the updated set point position the next time OHT vehicle 102 is required to dock with WIP carrying pod 110.

In some examples, the steps of collecting inertial measurement data, estimating the initial positioning error and updating the position set point are repeated every time a OHT vehicle docks with a WIP carrying pod. The continuous refinement of the position set point of each OHT vehicle with each load port ensures that each OHT vehicle remains in alignment with all load port destinations in a semiconductor fabrication facility.

Figure 12:
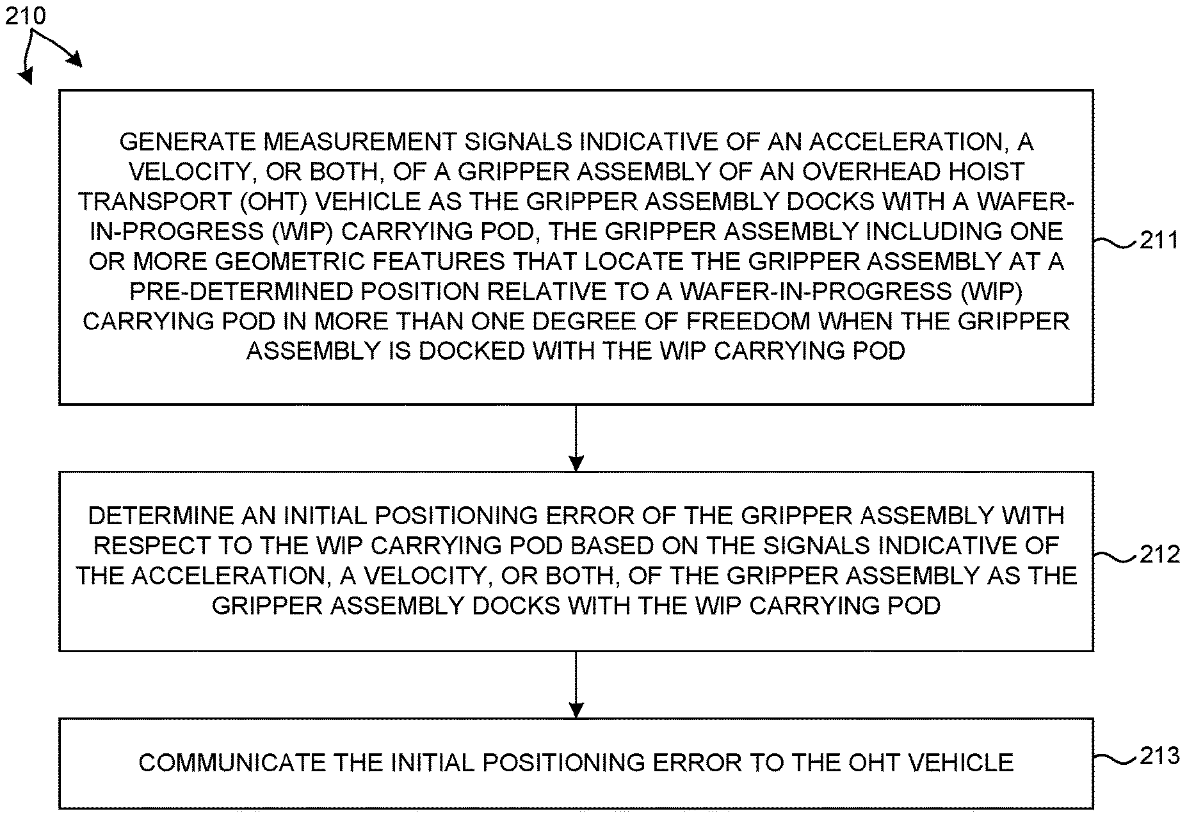
FIG. 12 illustrates a flowchart of another method suitable for alignment of an OHT system with respect to a load port of wafer fabrication tool as described herein.

FIG. 12 illustrates a flowchart of a method 210 suitable for alignment of an OHT system with respect to a load port of wafer fabrication tool as described herein. In some embodiments, an automated wafer carrying pod alignment system 170 described with reference to FIGS. 8-11 is operable in accordance with method 210 illustrated in FIG. 12. However, in general, the execution of method 210 is not limited to the embodiments of the automated wafer carrying pod alignment system described with reference to FIGS. 8-11. These illustrations and corresponding explanation are provided by way of example as many other embodiments and operational examples may be contemplated within the scope of this patent document.

In block 211, measurement signals indicative of an acceleration, a velocity, or both, of a gripper assembly of an overhead hoist transport (OHT) vehicle are generated as the gripper assembly docks with a wafer-in-progress (WIP) carrying pod. The gripper assembly includes one or more geometric features that locate the gripper assembly at a pre-determined position relative to a wafer-in-progress (WIP) carrying pod in more than one degree of freedom when the gripper assembly is docked with the WIP carrying pod.

In block 212, an initial positioning error of the gripper assembly with respect to the WIP carrying pod is determined based on the signals indicative of the acceleration, a velocity, or both, of the gripper assembly as the gripper assembly docks with the WIP carrying pod.

In block 213, the initial positioning error is communicated to the OHT vehicle.

In one or more exemplary embodiments, the functions described may be implemented in hardware, software, firmware, or my combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. An automated wafer carrying pod alignment system comprising:

an alignment frame including one or more geometric features that locate the alignment frame at a pre-determined position relative to a wafer-in-progress (WIP) carrying pod in more than one degree of freedom when the alignment frame is in contact with the WIP carrying pod;

a digital image capture device coupled to the alignment frame, the digital image capture device having a field of view oriented in a direction opposite the WIP carrying pod when the alignment frame is in contact with the WIP carrying pod;

one or more computing systems coupled to the alignment frame, the one or more computing systems configured to:

receive an image captured by the digital image capture device, wherein an overhead hoist transport (OHT) vehicle is within the field of view of the digital image capture device;

determine a location of the OHT vehicle within the image;

determine a positioning error of the OHT vehicle relative to the alignment frame based on the location of the OHT vehicle within the image; and communicate the positioning error to the OHT vehicle.

2. The automated wafer carrying pod alignment system of claim 1, further comprising:

a rechargeable battery coupled to the alignment frame and electrically coupled to the one or more computing systems, the digital image capture device, or both.

3. The automated wafer carrying pod alignment system of claim 1, the one or more computing systems including a wireless communication device, the wireless communication device communicatively linked to the overhead transportation vehicle, wherein the positioning error is communicated from the wireless communication device to the OHT vehicle.

4. The automated wafer carrying pod alignment system of claim 1, wherein the digital image capture device is a stereo camera.

5. The automated wafer carrying pod alignment system of claim 1, wherein the determining of the location of the OHT vehicle involves extracting one or more geometric features of the OHT vehicle from the image and determining the pixel locations associated with the one or more features in the image.

6. The automated wafer carrying pod alignment system of claim 5, wherein the one or more geometric features of the OHT vehicle includes one or more geometric features that locate a gripper assembly of the OHT vehicle at a pre-determined position relative to the wafer-in-progress (WIP) carrying pod in more than one degree of freedom when the gripper assembly is in contact with the WIP carrying pod.

7. A method comprising:

locating an alignment frame on a wafer-in-progress (WIP) carrying pod at a pre-determined position relative to a wafer-in-progress (WIP) carrying pod;

capturing a digital image including an overhead hoist transport (OHT) vehicle located above the WIP carrying pod, wherein the digital image is captured by a digital image capture device coupled to the alignment frame;

determining a location of the OHT vehicle within the captured image;

determining a positioning error of the OHT vehicle relative to the alignment frame based on the location of the OHT vehicle within the image; and communicating the positioning error to the OHT vehicle.

8. The method of claim 7, further comprising:

adjusting a positioning set point of the OHT vehicle based on the positioning error if the positioning error exceeds a predetermined threshold value.

9. The method of claim 7, further comprising:

providing an amount of electrical power to the digital image capture device from a rechargeable battery coupled to the alignment frame.

10. The method of claim 7, wherein the communicating of the positioning error to the OHT vehicle involves a wireless communication device coupled to the alignment frame and communicatively linked to the OHT vehicle.

11. The method of claim 7, wherein the digital image capture device is a stereo camera.

12. The method of claim 7, wherein the determining of the location of the OHT vehicle involves extracting one or more geometric features of the OHT vehicle from the image and determining the pixel locations associated with the one or more features in the image.

13. The method of claim 12, wherein the one or more geometric features of the OHT vehicle includes one or more geometric features that locate a gripper assembly of the OHT vehicle at a pre-determined position relative to the wafer-in-progress (WIP) carrying pod in more than one degree of freedom when the gripper assembly is in contact with the WIP carrying pod.

* * * * *